United States Patent
Greslehner-Nimmervoll et al.

(10) Patent No.: US 11,199,836 B2
(45) Date of Patent: Dec. 14, 2021

(54) DEVICE AND METHOD FOR MONITORING A DIGITAL CONTROL UNIT WITH REGARD TO FUNCTIONAL SAFETY, AND CONTROLLER

(71) Applicant: Infineon Technologies AG, Neubiberg (DE)

(72) Inventors: Bernhard Greslehner-Nimmervoll, Hagenberg i.M. (AT); Rainer Findenig, Linz (AT); Christian Schmid, Linz (AT)

(73) Assignee: Infineon Technologies AG, Neubiberg (DE)

( * ) Notice: Subject to any disclaimer, the term of this patent is extended or adjusted under 35 U.S.C. 154(b) by 353 days.

(21) Appl. No.: 16/269,594

(22) Filed: Feb. 7, 2019

(65) Prior Publication Data
US 2019/0250598 A1    Aug. 15, 2019

(30) Foreign Application Priority Data
Feb. 13, 2018  (DE) .................. 102018103152.1

(51) Int. Cl.
*G05B 23/02*  (2006.01)
*G05B 9/02*  (2006.01)
(Continued)

(52) U.S. Cl.
CPC .......... *G05B 23/0221* (2013.01); *G05B 9/02* (2013.01); *G05B 19/0428* (2013.01);
(Continued)

(58) Field of Classification Search
CPC ............ G05B 23/0221; G05B 23/0224; G05B 23/0264; G05B 23/0297; G05B 9/02; G06F 16/9014; H03M 13/093
See application file for complete search history.

(56) References Cited

U.S. PATENT DOCUMENTS 5,699,510 A * 12/1997 Petersen ............. G06F 11/1612
714/42
8,316,238 B2    11/2012 Mergen et al.
(Continued)

FOREIGN PATENT DOCUMENTS

CN    101542466 A    9/2009
JP    S6330911 A    2/1988

OTHER PUBLICATIONS

Ram Kumar Paul et al., "Prototype VME & CAMAC form factor Timestamping module development for Nuclear Physics Experiment", Proceedings of the DAE-BRNS Symp. Od Nucl. Phys. 60, 2015, 2 pages.

*Primary Examiner* — Bryan Bui
(74) *Attorney, Agent, or Firm* — Harrity & Harrity, LLP (57) ABSTRACT

A device for monitoring a digital control unit with regard to functional safety is proposed. The device comprises an interface configured to receive a control signal of the digital control unit for a circuit component. The control signal represents a digital value. Furthermore, the device comprises a timer circuit configured to output an associated timer value in each case for successive points in time. The device furthermore comprises a hash value generator, which is configurable, in response to a change in the digital value, to recalculate a hash value on the basis of the change in the digital value and the timer value at the point in time of the change in the digital value.

20 Claims, 3 Drawing Sheets

(51) Int. Cl.
*H03M 13/09* (2006.01)
*G06F 16/901* (2019.01)
*G05B 19/042* (2006.01)

(52) U.S. Cl.
CPC ..... *G05B 23/0224* (2013.01); *G05B 23/0264* (2013.01); *G05B 23/0297* (2013.01); *G06F 16/9014* (2019.01); *H03M 13/093* (2013.01)

(56) References Cited

U.S. PATENT DOCUMENTS

| | | |
|---|---|---|
| 2003/0055552 A1 | 3/2003 | Akins et al. |
| 2003/0221114 A1 | 11/2003 | Hino et al. |
| 2009/0043993 A1 | 2/2009 | Ford et al. |
| 2009/0112335 A1* | 4/2009 | Mehta .................... G05B 17/02 700/29 |
| 2014/0032976 A1 | 1/2014 | Shin et al. |
| 2016/0062331 A1 | 3/2016 | Von Wendorff |
| 2016/0239362 A1* | 8/2016 | Edmiston ............ G06F 11/0721 |

* cited by examiner

DEVICE AND METHOD FOR MONITORING A DIGITAL CONTROL UNIT WITH REGARD TO FUNCTIONAL SAFETY, AND CONTROLLER

RELATED APPLICATION

This application claims priority under 35 U.S.C. § 119 to German Patent Application No. 102018103152.1, filed on Feb. 13, 2018, the contents of which are incorporated by reference herein in their entirety.

TECHNICAL FIELD

Example implementations are concerned with the monitoring of digital control units with regard to functional safety. In particular, example implementations are concerned with a device and a method for monitoring a digital control unit with regard to functional safety, and a controller.

BACKGROUND

In various technological fields, control modules are used to drive one or more circuit components of a system. In order to be able to ensure the functional safety of the system, the control modules are often monitored. In this way, it is possible to check whether a sequence performed or a data stream is correct. In this case, the monitoring is often very complex and may therefore cause a high energy consumption.

SUMMARY

There is thus a need to provide an improved technology for monitoring the functional safety of control facilities.

The need can be met by the subject matter of the patent claims.

A first example implementation relates to a device for monitoring a digital control unit with regard to functional safety. The device comprises an interface configured to receive a control signal of the digital control unit for a circuit component. The control signal represents a digital value. Furthermore, the device comprises a timer circuit configured to output an associated timer value in each case for successive points in time. The device furthermore comprises a hash value generator, which is configurable, in response to a change in the digital value, to recalculate a hash value on the basis of the change in the digital value and the timer value at the point in time of the change in the digitial value.

In some example implementations, the hash value generator is configured to recalculate the hash value only if an enable signal is present at a signal input of the hash value generator, wherein the device furthermore comprises a control circuit configured to output the enable signal to the signal input of the hash value generator if the control circuit ascertains the change in the digital value.

In accordance with some example implementations, the control circuit is configured to output the enable signal to the signal input of the hash value generator only if a monitoring signal received by the control circuit indicates that the control signal for the circuit component is intended to be monitored.

In some example implementations, the control circuit is furthermore configured to determine the change in the digital value on the basis of a comparison of an instantaneous value of the digital value with a stored earlier value of the digital value, and wherein the control circuit is furthermore configured to reset the stored earlier value of the digital value to a predetermined value if the monitoring signal indicates that the control signal for the circuit component is not intended to be monitored.

In accordance with some example implementations, the timer circuit is furthermore configured to reset the timer value to a predetermined value if the monitoring signal indicates that the control signal for the circuit component is not intended to be monitored.

In some example implementations, the device is configured to monitor the control signal in response to a received activation signal, wherein the hash value generator is configured to output a predetermined value as hash value if the activation signal indicates a beginning of an active state of the device.

In accordance with some example implementations, the interface is furthermore configured to receive a validation signal, wherein the validation signal indicates whether a signal section to be monitored of the control signal is involved, and wherein the interface is furthermore configured to set the digital value to a predetermined value if the validation signal indicates that a signal section to be monitored of the control signal is not involved.

In some example implementations, a bit length of the timer value is identical to the bit length of the digital value.

In accordance with some example implementations, the device furthermore comprises a bit length conversion circuit configured to adapt a bit length of the timer value to a bit length of the digital value if the bit length of the timer value is different than the bit length of the digital value, and to output the bit-length-adapted timer value at the point in time of the change in the digital value as timer value to the hash value generator.

In some example implementations, the hash value generator is configured to recalculate the hash value on the basis of a method for cyclic redundancy checking.

In accordance with some example implementations, the timer circuit is a counter that cyclically outputs an incremented count as timer value.

A further example implementation relates to a controller. The controller comprises a signal output configured to output a control command for a digital control unit, wherein the control command is configured to cause the digital control unit to drive a circuit component by way of a control signal. Furthermore, the controller comprises a signal input configured to receive a hash value, and an analysis circuit configured to compare the hash value with a reference hash value. In this case, the reference hash value is based on an expected change in a digital value of the control signal on account of the control command and an expected point in time of the change in the digital value.

In some example implementations, the analysis circuit is furthermore configured to determine an error in the implementation of the control command by the digital control unit if the hash value deviates from the reference hash value.

In accordance with some example implementations, the analysis circuit is furthermore configured to determine the reference hash value using a simulation of the digital control unit.

In some example implementations, the hash value is based on an actual change in the digital value on account of the control command and an actual point in time of the change in the digital value.

Furthermore, one example implementation relates to a method for monitoring a digital control unit with regard to functional safety. The method comprises receiving a control signal of the digital control unit for a circuit component. In this case, the control signal represents a digital value. Furthermore the method comprises outputting an associated timer value for successive points in time. In response to a change in the digital value, the method additionally comprises recalculating a hash value on the basis of the change in the digital value and the timer value at the point in time of the change in the digital value.

In accordance with some example implementations, the method furthermore comprises receiving a monitoring signal indicating that the control signal for the circuit component is intended to be monitored, wherein the hash value is recalculated only if the monitoring signal indicates that the control signal for the circuit component is intended to be monitored.

In some example implementations, the method furthermore comprises determining the change in the digital value on the basis of a comparison of an instantaneous value of the digital value with a stored earlier value of the digital value; and resetting the stored earlier value of the digital value to a predetermined value if the monitoring signal indicates that the control signal for the circuit component is not intended to be monitored.

In accordance with some example implementations, the method furthermore comprises receiving a validation signal indicating whether a signal section to be monitored of the control signal is involved, and setting the digital value to a predetermined value if the validation signal indicates that a signal section to be monitored of the control signal is not involved.

A further example implementation relates to a method comprising outputting a control command for a digital control unit. The control command is designed to cause the digital control unit to drive a circuit component by way of a control signal. The method furthermore comprises receiving a hash value and comparing the hash value with a reference hash value. In this case, the reference hash value is based on an expected change in a digital value of the control signal on account of the control command and an expected point in time of the change in the digital value.

Further example implementations additionally relate to a program comprising a program code for carrying out one of the methods described herein when the program is executed on a processor or a programmable hardware component.

Moreover example implementations relate to a nonvolatile machine-readable medium, such as a non-transitory computer-readable medium, on which is stored a program comprising a program code for carrying out one of the methods described herein when the program is executed on a processor or a programmable hardware component.

Furthermore, one example implementation relates to yet another device for monitoring a digital control unit with regard to functional safety. The device comprises means for receiving a control signal of the digital control unit for a circuit component. In this case, the control signal represents a digital value. Furthermore, the device comprises means for outputting an associated timer value for successive points in time. The device furthermore comprises means for recalculating a hash value in response to a change in the digital value and on the basis of the change in the digital value and the timer value at the point in time of the change in the digital value.

One example implementation additionally also relates to a control device. The control device comprises means for outputting a control command for a digital control unit. The control command is designed to cause the digital control unit to drive a circuit component by way of a control signal. The control device furthermore comprises means for receiving a hash value and means for comparing the hash value with a reference hash value. In this case, the reference hash value is based on an expected change in a digital value of the control signal on account of the control command and an expected point in time of the change in the digital value.

BRIEF DESCRIPTION OF THE FIGURES

Some examples of devices and/or methods are explained in greater detail merely by way of example below with reference to the accompanying figures, in which.

DESCRIPTION

Various examples will now be described thoroughly with reference to the accompanying figures, in which some examples are illustrated. In the figures, the thicknesses of lines, layers and/or regions may be illustrated in enlarged fashion for elucidation purposes.

While further examples are suitable for various modifications and alternative forms, some specific examples thereof are accordingly shown in the figures and described thoroughly hereinbelow. However, this detailed description does not limit further examples to the specific forms described. Further examples can cover all modifications, counterparts and alternatives that fall within the scope of the disclosure. Throughout the description of the figures, identical reference signs refer to identical or similar elements which can be implemented identically or in modified form in a comparison with one another, while they provide the same or a similar functionality.

It goes without saying that if one element is designated as "connected" or "coupled" to another element, the elements can be connected or coupled directly or via one or more intermediate elements. If two elements A and B are combined using an "or", this should be understood such that all possible combinations are disclosed, i.e. only A, only B, and A and B. An alternative wording for the same combination is "at least one from A and B". The same applies to combinations of more than two elements.

The terminology used for describing specific examples is not intended to be limiting for further examples. If a singular form, e.g. "a, an" and "the", is used and the use of only a single element is defined neither explicitly nor implicitly as obligatory, further examples can also use plural elements in order to implement the same function. If a function is described below as being implemented using a plurality of elements, further examples can implement the same function using a single element or a single processing entity. Furthermore, it goes without saying that the terms "comprises", "comprising", "has" and/or "having" in their usage indicate with greater precision the presence of the specified features, integers, steps, operations, processes, elements, components and/or a group thereof, but do not exclude the presence or the addition of one or more other features, integers, steps, operations, processes, elements, components and/or a group thereof.

Unless defined otherwise, all terms (including technical and scientific terms) are used here in the customary meaning in the field with which examples are associated.

Figure 1:
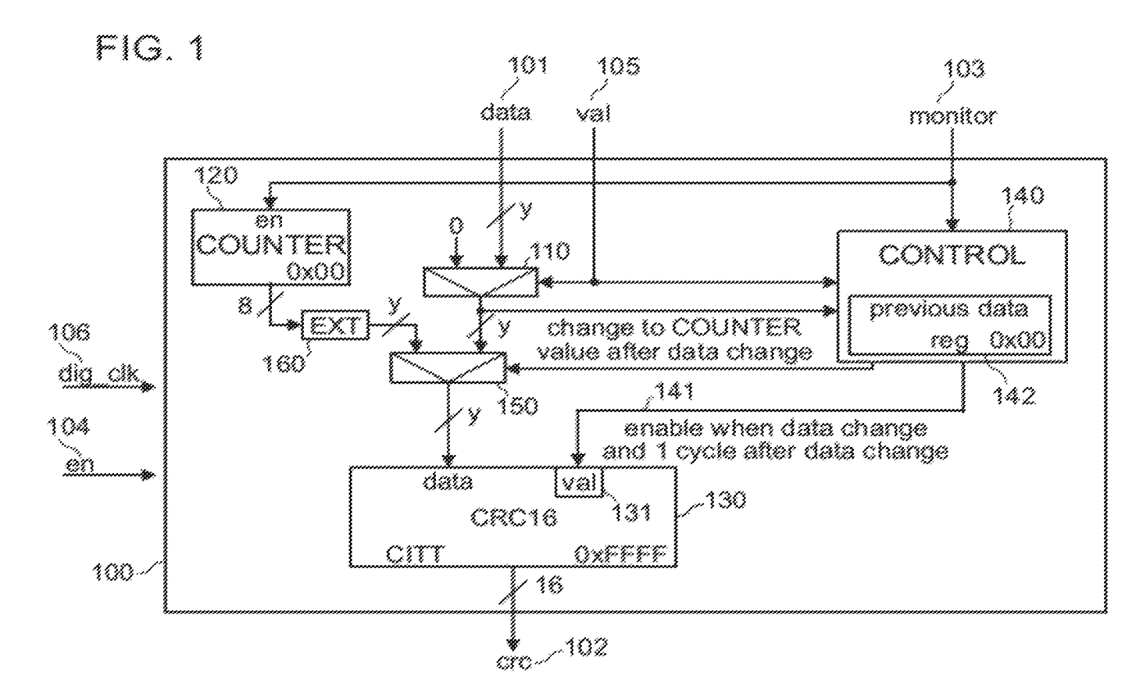
FIG. 1 shows one example implementation of a device for monitoring a digital control unit with regard to functional safety.

FIG. 1 shows a device 100 for monitoring a digital control unit (not illustrated) with regard to functional safety. A digital control unit is a dedicated circuit or a circuit for executing software in conjunction with associated implemented software configured to drive one or more further circuit components. In this case, the digital control unit is embodied as a digital circuit. Functional safety denotes that part of the safety of a circuit, of a system, etc., which is dependent on the correct function of the circuit, of the system, etc., that is to say the unit and methods proceeding within the unit function as envisaged. This is contrasted with security, which is concerned with protection against hazards produced by intentional processes typically brought about externally (e.g. manipulations by an attacker, etc.).

Device 100 comprises an interface 110, configured to receive a control signal 101 of the digital control unit for a circuit component controlled by it. In this case, the control signal 101 represents a digital value. The digital value indicates a specific command or instruction or information of the digital control unit for the circuit component. The digital value can comprise one or a plurality of bits. By way of example, the digital value can indicate in binary form an on or off state (active or inactive state) of the circuit component or a data word having a length of a plurality of bits for the circuit component.

Furthermore, device 100 comprises a timer circuit 120 configured to output an associated timer value in each case for successive points in time. In this case, the respective timer value represents the associated point in time. The timer value can be output e.g. in the form of a time value describing the concrete associated point in time. As indicated in FIG. 1, the timer circuit 120 can also be designed as a counter. The counter is configured cyclically to output an incremented count as timer value. In this case, each count represents the associated point in time when the count is output. Alternatively, timer circuit 120 can also be configured to output the timer value in a different form or representation. As indicated in FIG. 1, the timer circuit 120 (just like further components of the device 100) can operate on the basis of a received digital clock signal 106.

Furthermore, device 100 comprises a hash value generator 130. The hash value generator 130 is configurable (or configured), in response to a change in the digital value of the control signal 101, to recalculate a hash value 102 on the basis of the change in the digital value and the timer value at the point in time of the change in the digital value. The hash value generator 130 can use any desired hash function to map the change in the digital value and the associated timer value onto the hash value 102. As indicated in FIG. 1, the hash value generator 130 can be configured, for example, to recalculate the hash value 102 on the basis of a method for cyclic redundancy checking (referred to as cyclic redundancy check). The hash value 102 can make it possible to map the behavior of the digital control unit in relation to the generation of the control signal 101. The change in the hash value 102 is characteristic of the function of the digital control unit. In other words: the hash value 102 or the change thereof over time can be utilized for logging the actual behavior of the digital control unit. Through comparison with e.g. reference hash values, by means of the hash value 102 it is possible to deduce whether the digital control unit is functioning correctly. That is to say that the hash value 102 can be utilized for monitoring the functional safety of the digital control unit.

In this case, however, the hash value generator 130 calculates the hash value 102 only if the digital value of the control signal actually changes. Compared with customary methods, the recalculation of the hash value can thus be effected less frequently or only in the case of actual data changes. Accordingly, a required energy (power) for the provision of the hash value 102 can be reduced. The energy (power) consumed or required for the monitoring of the functional safety of the digital control unit can thus likewise be reduced owing to the reduced computational complexity.

In accordance with some example implementations, the hash value generator 130 can also be configurable (or configured), in response to a change in the digital value of the control signal 101, to recalculate the hash value 102 only on the basis of the change in the digital value (i.e. without taking account of the timer value at the point in time of the change in the digital value).

The hash value generator 130 furthermore comprises a signal input 131. The hash value generator 130 is configured to recalculate the hash value 102 only if an enable signal 141 is present at the signal input 131 of the hash value generator 130. In other words: the enable signal drives the hash value generator 130 in such a way that the hash value generator 130 responds only to the change in the digital value of the control signal 101. The enable signal 141 is provided by a control circuit 140. In this case, the control circuit 140 is configured to output the enable signal 141 to the signal input 131 of the hash value generator 130 if the control circuit 140 ascertains the change in the digital value.

In this case, the control circuit 140 is configured to output the enable signal 141 to the signal input 131 of the hash value generator only if a monitoring signal 103 received by the control circuit indicates that the control signal 101 for the circuit component is intended to be monitored. The monitoring signal 103 can thus be understood as a controlling signal for the device 100 in order to activate or deactivate the monitoring functionality of the device 100. Accordingly, a recalculation of the hash value 102 takes place only if the control signal 101 of the digital control unit for the circuit component is actually intended to be monitored. An unnecessary monitoring of the control signal 101 can thus be avoided.

By way of example, the control circuit 140 can be configured to determine the change in the digital value on the basis of a comparison of an instantaneous value of the digital value with a stored earlier value of the digital value. To that end, the control circuit 140, as indicated in FIG. 1, can have a memory 142. Memory 142 can in principle be any type of memory device suitable for storing information about the digital value. In accordance with example implementations, memory 142 can be embodied e.g. as a register. The control circuit 140 is furthermore configured to reset the stored earlier value of the digital value to a predetermined value (e.g. "0" or "0xFFFF"), if the monitoring signal 103 indicates that the control signal 101 for the circuit component is not intended to be monitored. In this way, it is possible to ensure that in the case of a renewed monitoring indicated by way of the monitoring signal 103, the determination of the change in the digital value of the control signal 101 begins in each case relative to the predetermined value.

Furthermore, the timer circuit 120 can also be controlled in response to the monitoring signal 103. By way of example, the timer circuit 120 can be configured to reset the timer value to a predetermined value (e.g. "1" or "0x00") if the monitoring signal 103 indicates that the control signal 101 for the circuit component is not intended to be monitored. In this way, it is possible to ensure that in the case of a renewed monitoring indicated by way of the monitoring signal 103, the timer value begins in each case with the predetermined value.

The device 100 is configured to be active in response to a received activation signal 104. The activation signal 104 can thus be understood as a controlling signal for the device 100 in order to activate or deactivate the device 100. In this case, the hash value generator 130 is configured to output a predetermined value (e.g. "0" or "0xFFFF") as a hash value if the activation signal 104 indicates a beginning of an active state of the device 100. In other words: if the device 100 is activated, the hash value generator 130 outputs the same hash value. In this way, it is possible to ensure that the hash value 102 is recalculated beginning from the same value. By way of example, the control circuit 140 can be configured to drive the hash value generator 130 to reset the hash value to the predetermined value if the activation signal 104 indicates the beginning or the end of the active state of the device 100.

Furthermore, it may be the case that the control signal 101 ought/need not always be monitored. Accordingly, the interface 110 is furthermore configured to receive a validation signal 105. The validations signal 105 indicates whether the instantaneous signal section of the control signal 101 is a signal section to be monitored of the control signal 101. The interface 110 is furthermore configured to set the digital value to a predetermined value (e.g. constant value or earlier value of the digital value stored in memory 142) if or as long as the validation signal 105 indicates that a signal section to be monitored of the control signal 101 is not involved. As a result, it is possible to ensure that the control circuit 140 does not determine a change in the digital value as long as the validation signal 105 indicates that a signal section to be monitored of the control signal 101 is not involved. Accordingly, the hash value 102 is also no longer recalculated by the hash value generator 130 (despite possible actual changes in the digital value of the control signal 101). In other words: by way of the validation signal 105 the device 100 can be driven to recalculate the hash value 102 only for a signal section to be monitored of the control signal 101. In this way, it is possible to avoid an unnecessary recalculation of the hash value 102 for signal sections of the control signal 101 that are not to be monitored, with the result that the energy (power) consumed or required for the monitoring of the functional safety of the digital control unit can be reduced owing to the reduced computational complexity.

As indicated in FIG. 1, the changed digital value of the control signal 101 and the associated timer value can be input sequentially, i.e. successively, into the hash value generator 130 in order to recalculate the hash value 102. To that end FIG. 1 shows a sequencing circuit 150 which is driven (caused) by the control circuit 140 to output firstly the changed digital value of the control signal and then the associated timer value as input to the hash value generator 130. Alternatively, the changed digital value of the control signal and the associated timer value can also be included in the hash value 102 in parallel in a clock cycle. In accordance with further example implementations the changed digital value of the control signal and the associated timer value can also be combined by way of an "XOR" operation.

In some example implementations, in this case, a bit length of the timer value can be identical to the bit length of the digital value. In other example implementations, the bit length of the timer value can also be different than the bit length of the digital value. The device 100 can furthermore comprise a bit length conversion circuit 160. Bit length conversion circuit 160 is configured to adapt the bit length of the timer value to the bit length of the digital value and to output the bit-length-adapted timer value at the point in time of the change in the digital value as timer value to the hash value generator 130. By way of example, the timer circuit 120 can be designed to output the timer value with a length of 8 bits (e.g. as an 8-bit count). If the data width i.e. the bit length of the digital value, is less than 8 bits, the bit length conversion circuit 160 can be configured to output the y (=bit length of the digital value) least significant bits of the 8 bit long timer value of the timer circuit 120 as a bit-length-adapted timer value to the hash value generator 130. If the data width, i.e. the bit length of the digital value, is greater than 8 bits, the timer value can be expanded by the same timer value, for example by the bit length conversion circuit 160. By way of example, for a digital value having a length of 14 bits, the bit-length-adapted timer value can be [13:0] =(timer value [5 . . . 0], timer value [7 . . . 0]).

In accordance with alternative example implementations, the bit length conversion circuit 160 can also be configured to adapt the bit length of the digital value to the bit length of the timer value and to output the bit-length-adapted digital value as digital value to the hash value generator 130.

As explained above, the digital control unit can in principle be any type of dedicated circuit or circuit for executing software in conjunction with associated implemented software in order to drive one or more arbitrary circuit components. This will be elucidated once again below on the basis of a more detailed example. The digital control unit can be used e.g. to drive one or more circuit components of a transmission channel for radar signals on a semiconductor chip. In particular, the transmission channel can be part of a frequency modulated continuous wave (FMCW) radar system. The one or the plurality of circuit components can then be for example part of a ramper circuit (transmission circuit, transmitter circuit) that generates frequency ramps or ramp sequences of a radar transmission signal. Accordingly, the control signal 101 can be control signal for one the circuit components of the ramper circuit.

In this case, data changes within the control signal 101 will usually occur only at the beginning of a ramp segment (a ramp sequence includes one or many ramp segments). As already described above, the hash value 102 calculated by the device 100 is a suitable means for monitoring the functionality of the digital control unit. The device 100 recalculates the hash value 102 only in response to changes in the digital value of the control signal 101, i.e. only in response to data changes. Accordingly, during the monitoring of the control signal 101 for the circuit component of the ramper circuit, the hash value 102 is usually recalculated once or a number of times on account of the data change only at the beginning of a ramp segment, since otherwise within the ramp segment normally no further data changes in the control signal 101 take place. The functional safety of the digital control unit for the circuit component of the ramper circuit can thus be implemented with reduced computational complexity or energy consumption compared with e.g. monitoring approaches that calculate hash values for each clock cycle of the digital control unit.

Since, besides the data change (i.e. the change in the digital value) the timer value is also included in the hash value 102, it is also possible to reconstruct whether the data change in the control signal 101 took place at the correct point in time or e.g. a few cycles earlier or later during the ramp sequence. In other words: a time stamp (generated by e.g. a running counter) in the hash value 102 is calculated after each data change. The hash value 102 can thus be understood as ramp sequence finger printing (RSFP). Alternatively, the changed data can also be subjected to an X-OR-operation with the time stamp. However, this approach has the disadvantage that the quality of the hash safety is reduced since specific errors could no longer be detected.

As already indicated above, e.g. CRC can be used as a hash algorithm for the hash value generator 130 on account of the good error detection properties and the area-efficient implementation in hardware. It is true that CRC sometimes requires a high computational complexity if the calculation is carried out using software. However, since only the data changes are included computationally in the CRC, the entire amount of data fed to the hash operation and therefore the computational complexity are reduced in contrast to e.g. an approach where the CRC is updated time-continuously over the entire ramp sequence. In this way, e.g. the ramp sequence can be modified and the CRC that was calculated by the RSFP device 100 can be compared with calculated reference CRC values in an appropriate time frame.

The ramp sequence finger printing (RSFP) generally ensures the correctness of the ramper circuit output. For monitoring the digital control unit for the circuit component of the ramper circuit, the hash value 102 can be determined for example by means of cyclic redundancy checking (e.g. CRC-16-CCITT with polynomial representation 0x1021). The initial value of the CRC can be e.g. 0xFFFF. Other hash functions, polynomials or initial values are likewise possible. It is only if the "monitor" input is active (i.e. the monitoring signal 103 indicates that the control signal 101 is intended to be monitored) that the data changes are calculated in the CRC checksum.

In some example implementations, it is necessary/intended to monitor e.g. only some configuration settings with regard to some specific ramp segments. By way of example, the IQ modulator phase of the transmission channel may be of interest only if power is output via a transmission antenna. Monitoring only a part of the sequence that is of interest allows the digital control unit (implemented e.g. as firmware) to change the phase of the radar transmission signal since the software does not have to change the IQ setting in a specific clock cycle of the sequence, but rather can change the IQ setting as long as a power amplifier of the transmission channel is switched off. This is indicated by the validation signal 105. If the input "validation" is inactive (i.e. the validation signal 105 indicates that a signal section to be monitored of the control signal 101 is not involved), the data input or the interface 110 is multiplexed to e.g. a constant zero value, which can be regarded as a data change by the control circuit 140.

After each data change which is identified by the control circuit 140 and if no further data changes occur in the current clock cycle, e.g. a counter value (as an example of a timer value) is calculated in the CRC checksum. The timer information from the timer circuit 120 (e.g. a counter) ensures identification of the fact that data changes took place at a specific point in time during the ramp sequence. The counter value is calculated in the CRC after a recorded data change, even if the monitor input is inactive (i.e. the monitoring signal 103 indicates that the control signal 101 is not intended to be monitored; the "monitor" input must be active, however, for data change).

As already explained above, the entire RSFP can be reset as soon as it is deactivated (i.e. the activations signal 104 indicates an end of the active state of the device 100 or an inactive state of the device 100).

The initial values of the earlier value—stored in the register of the control circuit 140—of the digital value and also of the count are predetermined (e.g. zero) and are reset to these values if the "monitor" input is inactive (i.e. the monitoring signal 103 indicates that the control signal 101 is not intended to be monitored).

The calculation of the CRC checksum for a digital control unit which drives one or more circuit components of a ramper circuit for a radar signal can comprise the following features:

1. activation of the device 100: initial count=0; CRC initial value=0xFFFF; earlier value of the digital value=0;
2. "monitor" input must be active otherwise no activity (except time stamp or count must be calculated in the CRC);
3. "validation" input is inactive: the data input can be regarded as zero overall (despite possible actual data change);
4. data change at the input: calculation in CRC checksum;
5. after one (a plurality of) data change(s), the current time stamp (count) can be calculated in the CRC checksum; and
6. "monitor" input inactive: counter is reset to zero.

The approach of calculating only the data changes in the hash function (e.g. CRC) (normally happens only for relatively infrequently occurring beginnings of a ramp segment) can ensure the correct output of the digital control unit. One example implementation relating to the verification of the correct functionality of a digital control unit on the basis of a hash value is described in greater detail below with reference to FIG. 2.

Figure 2:
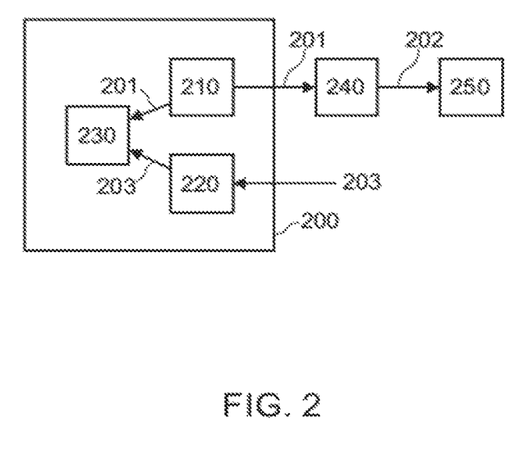
FIG. 2 shows one example implementation of a controller.

FIG. 2 shows a controller 200. The controller 200 comprises a signal output 210 configured to output a control command 201 for a digital control unit 240. The control command 201 is configured to cause the digital control unit 240 to drive a circuit component 250 by way of a control signal 202. By way of example, the digital control unit 240 in accordance with the above example can drive a circuit component of a ramper circuit of a transmission channel of a radar. However, the digital control unit 240 is not restricted to radar applications.

Furthermore, the controller 200 comprises a signal input 220 configured to receive a hash value 203. The hash value 203 is based on an actual change in a digital value of the control signal 202 on account of the control command 201 and an actual point in time of the change in the digital value of the control signal 202. By way of example, the hash value 203 can be determined or calculated in accordance with the principles described above in association with FIG. 1.

The controller 200 furthermore comprises an analysis circuit 230 configured to compare the hash value 203 with a reference hash value. The reference hash value is based on an expected change in the digital value of the control signal 202 on account of the control command 201 and an expected point in time of the change in the digital value of the control signal 202. In this case, the analysis circuit 230 can be embodied as a dedicated circuit or a circuit for executing software in conjunction with associated implemented software which is configured to compare the hash value 203 with a reference hash value.

The expected change in the digital value of the control signal 202 and also the expected point in time of the change in the digital value of the control signal 202 indicate how and when the digital control unit 240 would or should change the control signal 202 on account of the control command 201 in the case of a correct function. The reference hash value thus gives the expected hash value in the case of a correct function of a digital control unit 240. By comparing the actual hash value 203 with the reference hash value, it is then possible to determine whether the digital control unit 240 has implemented the control command 201 correctly by converting it into the corresponding change in the control signal 202. By way of example, the analysis circuit 230 can be configured to determine an error in the implementation of the control command 201 by the digital control unit 240 if the hash value 203 deviates from the reference hash value. Conversely, if the hash value 203 corresponds to the reference hash value, the analysis circuit 230 can be configured to determine a correct implementation of the control command 201 by the digital control unit 240.

The controller 200 can thus monitor the digital control unit 240 controlled by it with regard to its functional safety by the comparison of the hash values.

The reference hash value can be determined or stored in many kinds of ways. By way of example, the analysis circuit 230 can furthermore be configured to determine the reference hash value using a simulation of the digital control unit 240. Accordingly, the associated reference hash value can be determined for any type of control command or sequence of control commands. By way of example, the reference hash value in accordance with the principles described herein can also be recalculated (only) in response to the expected change in the digital value of the control signal 202 on account of the control command 201. In this way the reference hash value can be calculated more rapidly and with more power being conserved than if e.g. a hash calculation had to be carried out for every clock cycle of the digital control unit 240. The calculation of the reference hash value can thus require less power and e.g. also fewer CPU resources of the controller 200, and so they can be available for other tasks.

Alternatively reference hash values can also be based on reference measures (laboratory measurements) on the digital control unit 240 or a reference unit and is stored e.g. in a memory coupled to the analysis circuit 230.

In accordance with some example implementations, the analysis circuit 230 can also be a separate unit which is able to be coupled e.g. to the controller 200.

Figure 3:
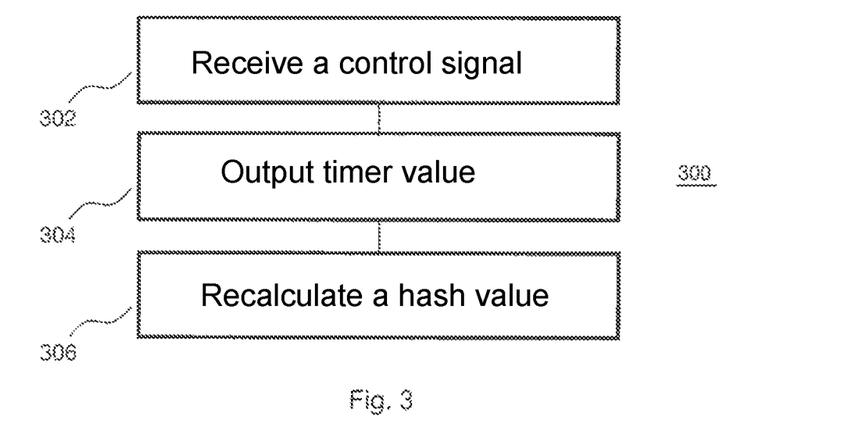
FIG. 3 shows a flow diagram of a first example implementation of a method for monitoring a digital control unit with regard to functional safety.
Figure 4:
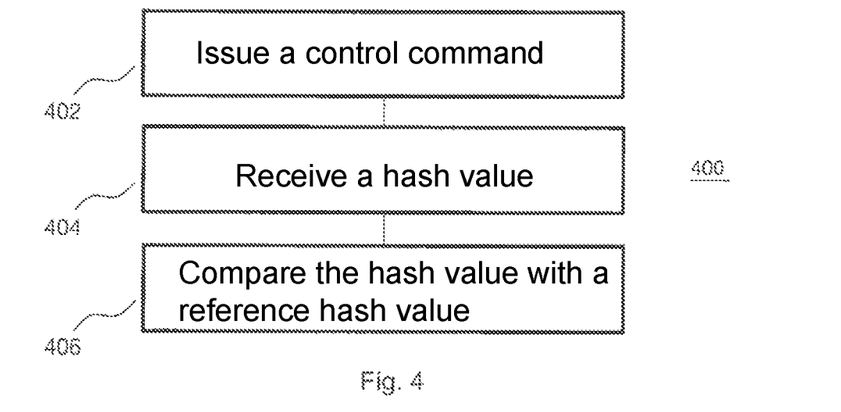
FIG. 4 shows a flow diagram of a first example implementation of a further method.

In order once again to summarize the above-described aspects for monitoring digital control units with regard to functional safety, flow diagrams of corresponding methods are shown in FIG. 3 and FIG. 4.

FIG. 3 shows a flow diagram of a method 300 for monitoring a digital control unit with regard to functional safety. Method 300 comprises receiving 302 a control signal of the digital control unit for a circuit component. In this case, the control signal represents a digital value. Furthermore, method 300 comprises outputting 304 an associated timer value for successive points in time. In response to a change in the digital value, method 300 additionally comprises recalculating 306 a hash value on the basis of a change in the digital value and the timer value at the point in time of the change in the digital value.

Further details and aspects of the method have been described above in association with further example implementations (e.g. FIG. 1). The method can comprise one or more optional features in accordance with the further example implementations.

In addition, FIG. 4 also shows a flow diagram of a further method 400, which comprises outputting 402 a control command for a digital control unit. The control command is designed to cause the digital control unit to drive a circuit component by way of a control signal. Method 400 furthermore comprises receiving 404 a hash value, and comparing 406 the hash value with a reference hash value. In this case, the reference hash value is based on an expected change in a digital value of the control signal on account of the control command and an expected point in time of the change in the digital value.

Further details and aspects of the method have been described above in association with further example implementations (e.g. FIG. 2). The method can comprise one or more optional features in accordance with the further example implementations.

The aspects and features that have been described together with one or more of the examples and figures described in detail above can also be combined with one or more of the other examples in order to replace an identical feature of the other example or in order additionally to introduce the feature into the other example.

Examples can furthermore be related to a non-transitory computer-readable medium storing a computer program comprising program code for carrying out one or more of the above methods when the computer program is executed on a computer or processor. Steps, operations or processes of various methods described above can be performed by programmed computers or processors. Examples can also cover program storage devices, e.g. digital data storage media, which are machine-, processor- or computer-readable and code machine-executable, processor-executable or computer-executable programs of instructions. The instructions carry out some or all of the steps of the methods described above or cause them to be carried out. The program storage devices can comprise or be e.g. digital memories, magnetic storage media such as, for example, magnetic disks and magnetic tapes, hard disk drives or optically readable digital data storage media. Further examples can also cover computers, processors or control units which are programmed to carry out the steps of the methods described above, or (field) programmable logic arrays (F)PLAs or (field) programmable gate arrays (F)PGAs which are programmed to carry out the steps of the methods described above.

The description and drawings present only the principles of the disclosure. Furthermore, all examples mentioned here are intended to be used expressly only for teaching purposes, in principle, in order to assist the reader in understanding the principles of the disclosure and the concepts contributed to by the inventor(s) for further development of the art. All statements herein regarding principles, aspects and examples of the disclosure and also concrete examples thereof are intended to encompass the counterparts thereof.

A function block designated as "means for . . . " carrying out a specific function can relate to a circuit or software configured for carrying out a specific function. Consequently, a "means for something" can be implemented as a "means configured for or suitable for something", e.g. a component, a circuit or software configured for or suitable for the respective task.

Functions of different elements shown in the figures including those function blocks designated as "means", "means for providing a signal", "means for generating a signal", etc. can be implemented in the form of dedicated hardware, e.g. "a signal provider", "a signal processing unit", "a processor", "a controller", etc., and as hardware capable of executing software in conjunction with associated software. When provided by a processor, the functions can be provided by a single dedicated processor, by a single jointly used processor or by a plurality of individual processors, some or all of which can be used jointly. However, the term "processor" or "controller" is far from being limited to hardware capable exclusively of executing software, but rather can encompass digital signal processor hardware (DSP hardware), application specific integrated circuits (ASICs), field programmable logic arrays (FPGAs), read only memory (ROM) for storing software, random access memory (RAM) and non-volatile memory devices (storage). Other hardware, conventional and/or customized, can also be included.

A block diagram can illustrate for example a rough circuit diagram which implements the principles of the disclosure. In a similar manner, a flow diagram, a flow chart, a state transition diagram, a pseudo-code and the like can represent various processes, operations or steps which are represented for example substantially in a computer-readable medium and are thus performed by a computer or processor, regardless of whether such a computer or processor is explicitly shown. Methods disclosed in the description or in the patent claims can be implemented by a component having a means for performing each of the respective steps of said methods.

It goes without saying that the disclosure of a plurality of steps, processes, operations or functions disclosed in the description or the claims should not be interpreted as being in the specific order, unless this is explicitly or implicitly indicated otherwise, e.g. for technical reasons. The disclosure of a plurality of steps or functions therefore does not limit them to a specific order unless said steps or functions are not interchangeable for technical reasons. Furthermore, in some examples, an individual step, function, process or operation can include a plurality of partial steps, functions, processes or operations and/or be subdivided into them. Such partial steps can be included and be part of the disclosure of said individual step, provided that they are not explicitly excluded.

Furthermore, the claims that follow are hereby incorporated in the detailed description, where each claim can be representative of a separate example by itself. While each claim can be representative of a separate example by itself, it should be taken into consideration that—although a dependent claim can refer in the claims to a specific combination with one or more other claims—other examples can also encompass a combination of the dependent claim with the subject matter of any other dependent or independent claim. Such combinations are explicitly proposed here, provided that no indication is given that a specific combination is not intended. Furthermore, features of a claim are also intended to be included for any other independent claim, even if this claim is not made directly dependent on the independent claim.

The invention claimed is:

1. A device, comprising:
    an interface configured to receive a control signal of a digital control unit for a circuit component,
        wherein the control signal represents a digital value relating to information indicative of the digital control unit;
    a timer circuit configured to determine a timer value for successive points in time; and
    a hash value generator configured to:
        recalculate a hash value, based on the digital value and the timer value, in response to a change in at least one of the digital value or the timer value from a previous digital value or a previous timer value, respectively, and
        send the hash value to a controller, different from the device, to determine, based on the hash value, an error relating to functional safety of the digital control unit.

2. The device as claimed in claim 1, wherein the hash value generator is configured to recalculate the hash value if an enable signal is present at a signal input of the hash value generator, and wherein the device further comprises a control circuit configured to output the enable signal to the signal input of the hash value generator if the control circuit determines the change in the digital value.

3. The device as claimed in claim 2, wherein the control circuit is configured to output the enable signal to the signal input of the hash value generator if a monitoring signal received by the control circuit indicates that the control signal for the circuit component is intended to be monitored.

4. The device as claimed in claim 3, wherein the control signal is further configured to reset the previous digital value to a predetermined value if the monitoring signal indicates that the control signal for the circuit component is not intended to be monitored.

5. The device as claimed in claim 3, wherein the timer circuit is further configured to reset the timer value to a predetermined value if the monitoring signal indicates that the control signal for the circuit component is not intended to be monitored.

6. The device as claimed in claim 2, wherein the device is configured to monitor the control signal based on a received activation signal, and wherein the hash value generator is configured to output a predetermined value as the hash value if the received activation signal indicates a beginning of an active state of the device.

7. The device as claimed in claim 1, wherein the interface is further configured to receive a validation signal, wherein the validation signal indicates whether a signal section to be monitored of the control signal is involved, and wherein the interface is further configured to set the digital value to a predetermined value if the validation signal indicates that the signal section to be monitored of the control signal is not involved.

8. The device as claimed in claim 1, wherein a bit length of the timer value is identical to a bit length of the digital value.

9. The device as claimed in claim 1, further comprising a bit length conversion circuit configured to adapt a bit length of the timer value to a bit length of the digital value, as a bit-length-adapted timer value, if the bit length of the timer value is different than the bit length of the digital value, and to output the bit-length-adapted timer value at a point in time, of the successive piints in time, of the change in the digital value as the timer value to the hash value generator.

10. The device as claimed in claim 1, wherein the hash value generator is configured to recalculate the hash value based on a method for cyclic redundancy checking.

11. The device as claimed in claim 1, wherein the timer circuit is a counter that cyclically outputs an incremented count as the timer value.

12. A controller, comprising:
    a signal output configured to output a control command of a digital control unit,
        wherein the control command is configured to cause the digital control unit to drive a circuit component using a control signal;
    a signal input configured to receive a hash value generated based on a digital value and a timer value; and
    an analysis circuit configured to:
        compare the hash value with a reference hash value,
            wherein the reference hash value is based on an expected change of the digital value of the control signal on account of the control command and an expected point in time of the expected change in the digital value, and determine, based on comparing the hash value with the reference hash value, an error relating to functional safety of the digital control unit.

13. The controller as claimed in claim 12, wherein determining the error is based on the hash value deviating from the reference hash value.

14. The controller as claimed in claim 12, wherein the analysis circuit is further configured to determine the reference hash value using a simulation of the digital control unit.

15. The controller as claimed in claim 12, wherein the error relates to an implementation of the control command by the digital control unit.

16. A method, comprising:
    receiving, by a device, a control signal of a digital control unit of a circuit component,
        wherein the control signal represents a digital value relating to information indicative of the digital control unit;
    determining, by the device and based on receiving the control signal, a timer value for successive points in time;
    recalculating, by the device, a hash value, based on the digital value and the timer value, in response to a change in at least one of the digital value or the timer value from a previous digital value or a previous timer value, respectively; and
    sending, by device, the hash value, to a controller, different from the device, to determine an error relating to functional safety of the digital control unit.

17. The method as claimed in claim 16, further comprising:
    receiving a monitoring signal indicating that the control signal for the circuit component is intended to be monitored,
        wherein the hash value is recalculated if the monitoring signal indicates that the control signal for the circuit component is intended to be monitored.

18. The method as claimed in claim 17, further comprising:
    resetting the previous digital value to a predetermined value if the monitoring signal indicates that the control signal for the circuit component is not intended to be monitored.

19. The method as claimed in claim 16, further comprising:
    receiving a validation signal indicating whether a signal section to be monitored of the control signal is involved; and
    setting the digital value to a predetermined value if the validation signal indicates that the signal section to be monitored of the control signal is not involved.

20. A non-transitory computer-readable medium storing a program comprising program code for carrying out the method as claimed in claim 16 when the program is executed on a processor or a programmable hardware component.

* * * * *

UNITED STATES PATENT AND TRADEMARK OFFICE
CERTIFICATE OF CORRECTION

PATENT NO. : 11,199,836 B2
APPLICATION NO. : 16/269594
DATED : December 14, 2021
INVENTOR(S) : Bernhard Greslehner-Nimmervoll et al.

Page 1 of 1

It is certified that error appears in the above-identified patent and that said Letters Patent is hereby corrected as shown below:

In the Claims

In Claim 9, Column 14, Line 44, "successive piints in time," should be changed to --successive points in time,--.

Signed and Sealed this
Twenty-second Day of February, 2022

Drew Hirshfeld
*Performing the Functions and Duties of the*
*Under Secretary of Commerce for Intellectual Property and*
*Director of the United States Patent and Trademark Office*